United States Patent
Jacobsen et al.

(10) Patent No.: US 6,555,408 B1
(45) Date of Patent: Apr. 29, 2003

(54) METHODS FOR TRANSFERRING ELEMENTS FROM A TEMPLATE TO A SUBSTRATE

(75) Inventors: Jeffrey Jay Jacobsen, Hollister; Mark A. Hadley, Newark; John Stephen Smith, Berkeley, all of CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 09/270,157

(22) Filed: Mar. 16, 1999

Related U.S. Application Data

(60) Provisional application No. 60/118,887, filed on Feb. 5, 1999.

(51) Int. Cl.[7] .............................................. H01L 21/00
(52) U.S. Cl. ........................... 438/28; 438/34; 438/110; 438/149; 349/73
(58) Field of Search ........................... 438/34, 142, 149, 438/106, 110, 28; 349/73

(56) References Cited

U.S. PATENT DOCUMENTS

| 5,772,905 A | * | 6/1998 | Chou ............................ 216/44 |
| 5,814,885 A | * | 9/1998 | Pogge et al. ................. 257/730 |
| 5,925,259 A | * | 7/1999 | Biebuyck et al. ............... 216/2 |
| 6,027,630 A | * | 2/2000 | Cohen .......................... 205/135 |
| 6,274,508 B1 | * | 8/2001 | Jacobsen et al. ............. 438/758 |
| 6,281,038 B1 | * | 8/2001 | Jacobsen et al. ............. 438/106 |

FOREIGN PATENT DOCUMENTS

| JP | 8-300257 | * | 8/1996 |

OTHER PUBLICATIONS

Verma et al., Fluidic Self–Assembly of Silicon Microstructures, 1995, IEEE, 0569–5503/95/000–1263, pp. 1263–1268.*

Talghader et al, Integration of Fluidically Self–Assembled Optoelectronic Devices Unsing a Silicon–Based Process, 1995, IEEE Photonics Technology Letters, vol. 7, No. 11, pp. 1321–1323.*

* cited by examiner

Primary Examiner—Amir Zarabian
Assistant Examiner—Jeff Vockrodt
(74) Attorney, Agent, or Firm—Blakely, Sokoloff, Taylor & Zafman LLP

(57) ABSTRACT

A method of transferring elements to be used in an assembly by placing elements in regions of a template. In one example of a method, each of the elements includes a functional component. A template holding a plurality of elements is then pressed into the receiving substrate by attaching at least one side of the template holding the elements onto the receiving substrate.

22 Claims, 8 Drawing Sheets

METHODS FOR TRANSFERRING ELEMENTS FROM A TEMPLATE TO A SUBSTRATE

This application claims the benefit of the earlier filing date of co-pending provisional application of Jeffrey Jay Jacobsen entitled, "Apparatuses and Methods for Forming Assemblies," Ser. No. 60/118,887, filed Feb. 5, 1999 and incorporated herein by reference.

GOVERNMENT RIGHTS NOTICE

This invention was made with government support with at least one of these contracts: Grant (Contract) Nos. AFOSR 91-0327; F49620-92-J-059-1; F33615-96-C-5111 with USAF/AFMC/ASC; DAA016-00-C-9234 USAMCAC (US Army); Northrop Grumman PO #8200014995 (subcontract, NOOO14-99-C-0395 (prime)); North Dakota State University Subcontract #4080, DMEA 90-01-C-0009 (prime) and University of Alaska, Fairbanks PO#FP201509 (subcontract), DMEA 90-01-C-0009 (prime). The Government has certain rights to this invention.

BACKGROUND OF THE INVENTION

1. Field of the Invention

The present invention relates generally to the field of fabricating display panels. More particularly, the present invention relates to apparatuses and methods for forming displays wherein elements are placed on a template (also referred to as a donor substrate) and are thereafter transferred to a receiving substrate.

2. Description of Related Art

Fabrication of display panels is well known in the art. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. Liquid crystal material includes, but is not limited to, twisted nematic (TN), Super TN, double STN, and ferroelectric. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors in at least some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly; an example of this process is described in U.S. Pat. No. 5,545,291. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. iD shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly. Using this technique, various blocks, each containing a functional component, may be fabricated on one substrate and then separated from that substrate and assembled onto a separate rigid substrate through the fluidic self assembly (FSA) process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 which was filed Feb. 16, 1999 by the inventor John Stephen Smith and which is entitled "Functionally Symmetric Integrated Circuit Die". This application is hereby incorporated herein by reference.

As noted above, FIGS. 1B and 1D illustrate a display substrate 12 with blocks 14 formed in the rigid substrate 12. These blocks 14 may be deposited through an FSA process. In the FSA process, a slurry containing the blocks 14 is deposited over the rigid substrate 12 and the blocks 14 rest in corresponding openings in the substrate 12.

FIG. 2 shows a block 14 and a circuit element (not shown) on the top surface 18 of block 14. Generally, blocks 14 have a trapezoidal cross-section where the top of the block is wider than the bottom of the block.

FIG. 3 shows block 14 in a recessed region of the rigid substrate 12. Between the block and the rigid substrate is an eutetic layer 13. The block has a top surface 18.

FIG. 4 shows a planar side view of a rigid substrate coupled to a rigid display backplane with a plurality of blocks between the display backplane 30 and substrate 12. The plurality of blocks are functionally part of the display backplane 30 and are deposited onto receptor regions of the substrate 12. Each block drives at least one transparent pixel electrode. The pixel is fabricated over a transistor which is fabricated in the block.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid 20 substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration. The interconnect between the rows and columns is comprised of flexible and conductive material. For example, the interconnect could be made of conductive metals. FIG. 6 shows a top view of a plurality of pixel electrodes 48 in a backplane 46.

While the foregoing explains generally how flat panel displays are created, there are several disadvantages inherent to the related art. Industry needs a cost effective, efficient, and practical method for transferring elements to substrates. Accordingly, it is desirable to reduce the cost and the time to produce a display by directly transferring blocks to a substrate.

BRIEF SUMMARY OF THE INVENTION

The present invention provides methods and apparatuses for transferring elements from a reusable or disposable template into openings of a receiving substrate. In one particular example of the present invention, the plurality of elements are in a slurry. These elements fall into receiving regions on a template. These elements are then directly transferred to a receiving substrate by placing the template onto the substrate. The elements in the template face a surface of a substrate and the template or the elements contact the substrate. The elements may create recessed regions in the receiving substrate. The template is then removed and elements remain in the receiving substrate.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example and is not limited in the figures of the accompanying drawings in which like references indicate similar elements. Note also that the following figures are not necessarily drawn to scale.

DETAILED DESCRIPTION OF THE INVENTION

The following description and drawings are illustrative of the invention and are not to be construed as limiting the invention. The present invention relates generally to the field of transferring blocks to openings in a receiving substrate. A reusable or disposable template is used to generate these elements. By using a template, production time in manufacturing a display may be reduced and cost savings are realized. The present invention may be used to fabricate a variety of displays that incorporate different types of arrays. Other assemblies (e.g., detector arrays and MEMS—microelectro-mechanical structures) may also be fabricated using aspects of the present invention.

The invention applies to rigid and flexible substrates. Blocks with circuit elements thereon may be transferred to a flexible substrate. The blocks are contained in a slurry which is deposited onto the flexible substrate. Although blocks may be comprised of single crystal silicon or other like material which makes the block rigid, the substrate may still be flexible because the size of these blocks (50×100 microns or 100×100 microns) is small in comparison to the flexible substrate. The flexible substrate forms part of a display backplane. The flexible or rigid displays may be either an active matrix or a passive matrix displays.

Typically, each element in the array includes at least one functional component that may be an electrical component, a chemical component, or an electromechanical structural element that may be micro-electro-mechanical structure element (MEMS). The various methods of the present invention are illustrated in certain detailed examples with regard to the manufacture of an liquid emitting diode (LED) display, but it will be recognized that the invention has wider applicability. Merely by way of example, the invention may be applied to the fabrication of an electronic array which can be used to deliver precise voltages for the control of liquid crystal cells to create a liquid crystal display or light emitting diode or may be used for other types of displays such as EL displays, transmissive displays such as TFT and high-resolution polysilicon displays, reflective displays, LED displays, OLED displays, U/DCP displays, and EP displays and also for other applications requiring sampling or producing electrical signals over a large array of electrodes or other circuit elements such as memories and imaging arrays and photo-diode arrays.

Figure 1A:
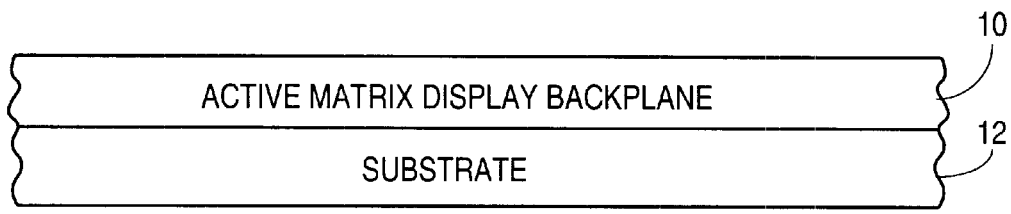
FIG. 1A shows a planar side view of an active matrix display backplane coupled to a rigid substrate.
Figure 1B:
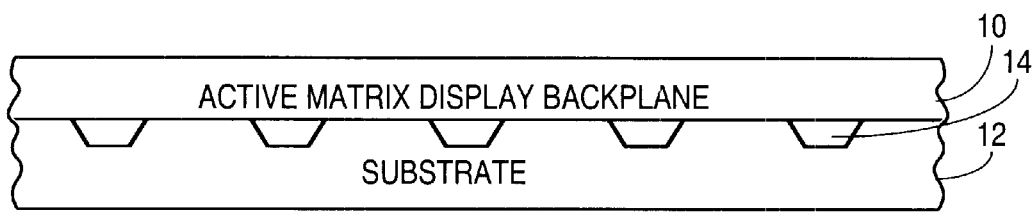
FIG. 1B shows a planar side view of an active matrix display backplane coupled to a rigid substrate wherein a plurality of blocks are part of the active matrix display.
Figure 1C:
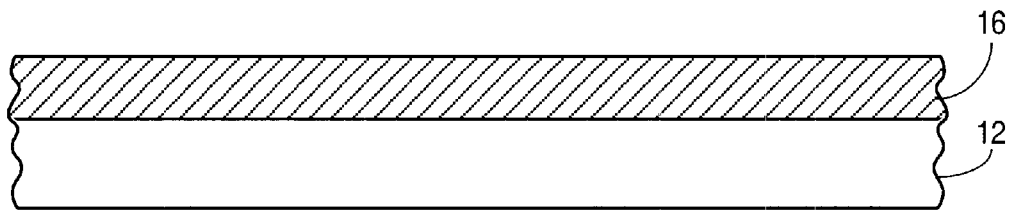
FIG. 1C shows a planar side view of a reflective display backplane coupled to a rigid substrate.
Figure 1D:
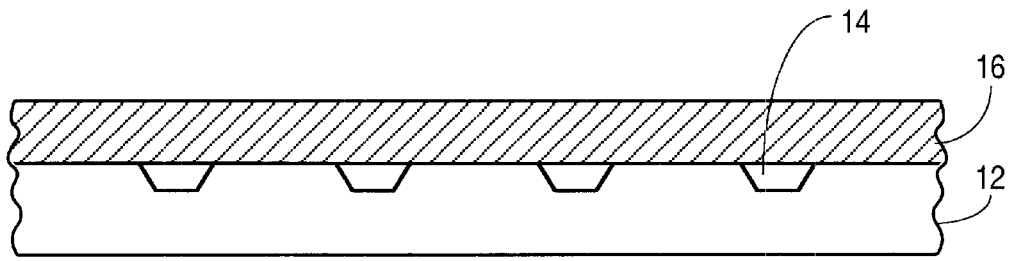
FIG. 1D shows a planar side view of a reflective display backplane coupled to a rigid substrate wherein a plurality of blocks are coupled to the reflective display and to the rigid substrate.
Figure 2:
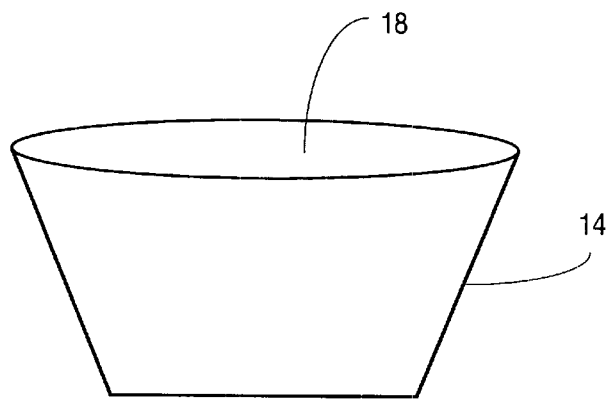
FIG. 2 shows a top perspective view of a circuit element block.
Figure 3:
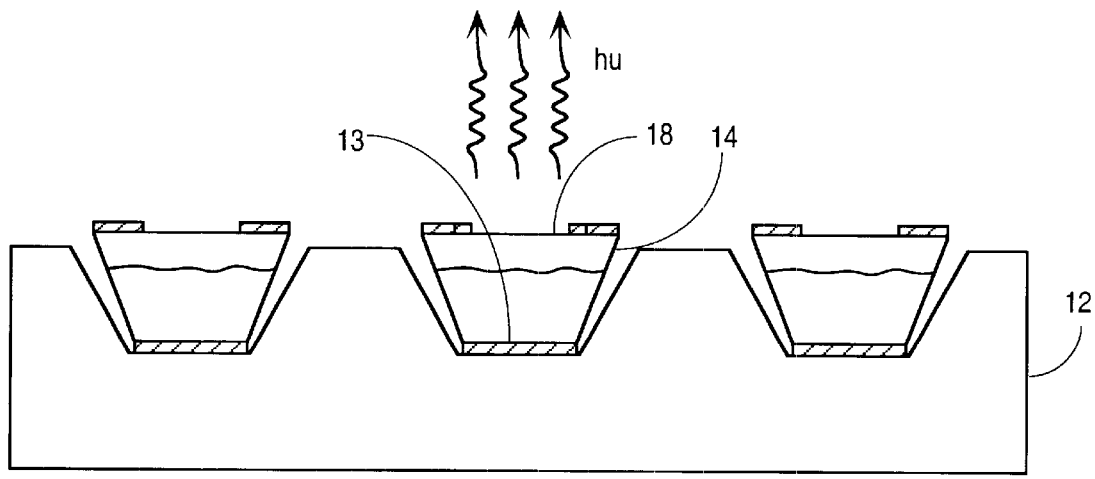
FIG. 3 shows a planar side view of blocks in recessed regions of the rigid substrate and a metalization surface on the blocks.
Figure 4:
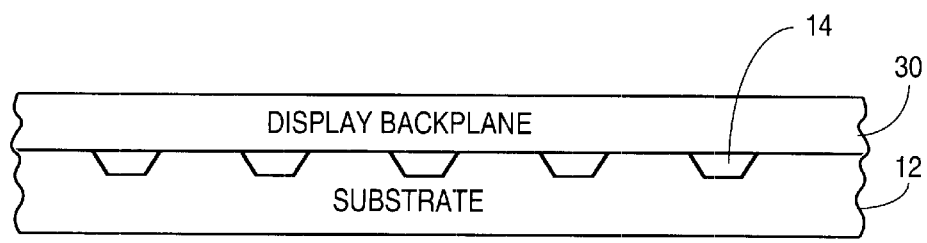
FIG. 4 shows a planar side view of a rigid substrate coupled to a rigid display backplane with a plurality of blocks between the display backplane and substrate.
Figure 5:
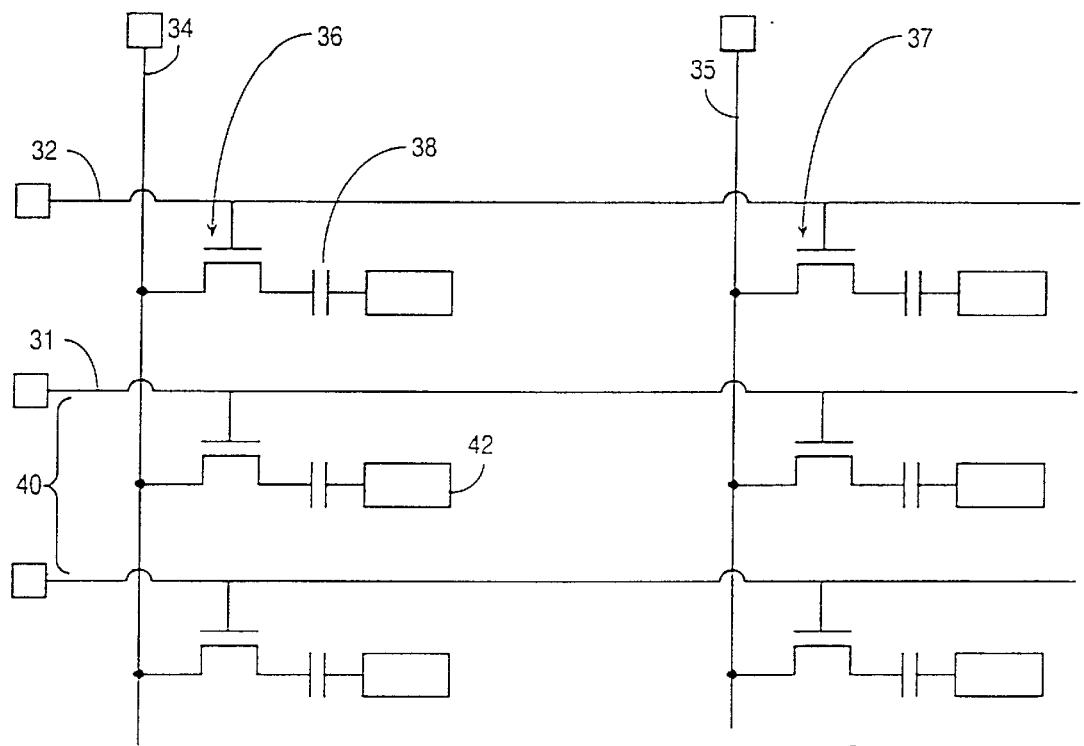
FIG. 5 schematically represents a portion of an array of an active matrix backplane.
Figure 6:
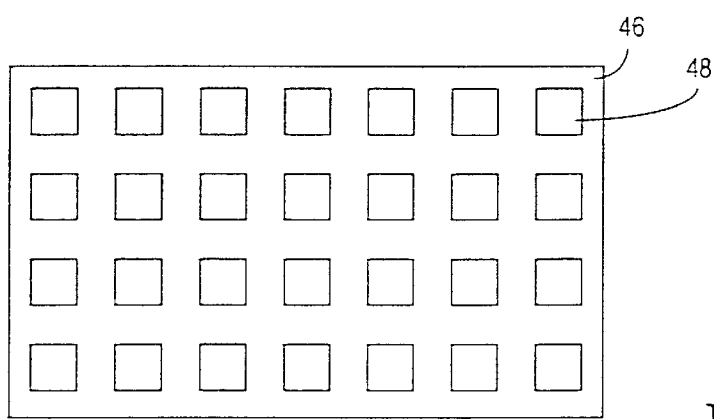
FIG. 6 shows a top view of a plurality of pixel electrodes in a backplane.
Figure 7A:
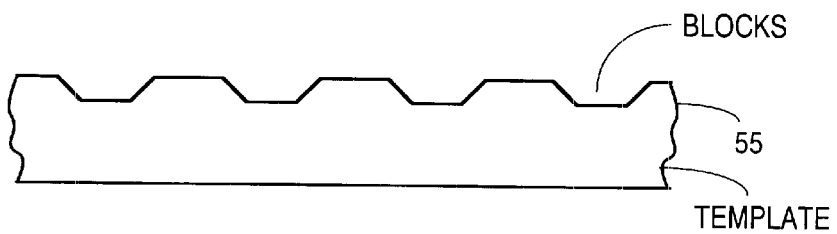
FIG. 7A shows a planar side view of a template.
Figure 7B:
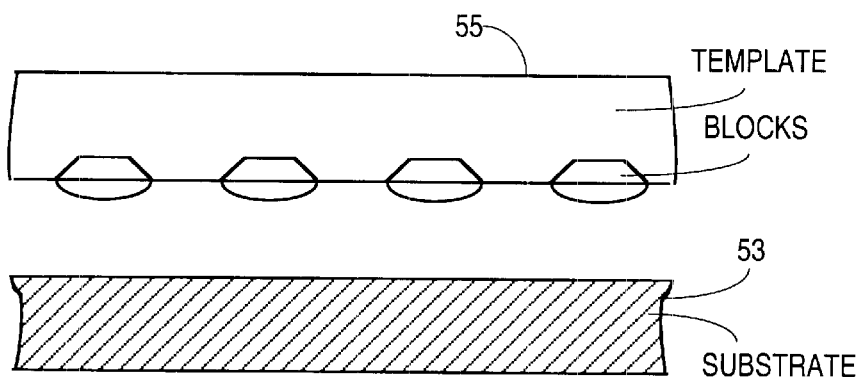
FIG. 7B shows a planar side view of a template wherein blocks are seated in recessed regions.

FIGS. 7A through 7E show planar side views as to how the transfer of blocks with circuit elements thereon are transferred to substrates that are used to form displays or other assemblies. FIG. 7A shows a planar side view of a template (donor substrate) 55. The template 55 may be comprised of rigid material such as metal including steel, stainless steel, molybdenum, aluminum, invar, beryllium, copper, brass, and glasses such as quartz, soda lime, borosilicate or plastics such as polyimide, polyamideimde, ABS, PVC, acrylic, polycarbonate, nylon, and ryton. These templates are manufactured by a variety of methods such as injection molding or by using a press that makes impressions into a template base comprised of the materials listed above. FIG. 7B shows a planar side view of a template 55 wherein blocks are seated in recessed regions. The blocks may be kept in place by a variety of methods. In one case, the blocks may be deposited by FSA onto the template and then secured by a release tape which is placed over the blocks and the top surface of the template. Additionally, electrostatic forces or vacuum may be used.

Figure 7C:
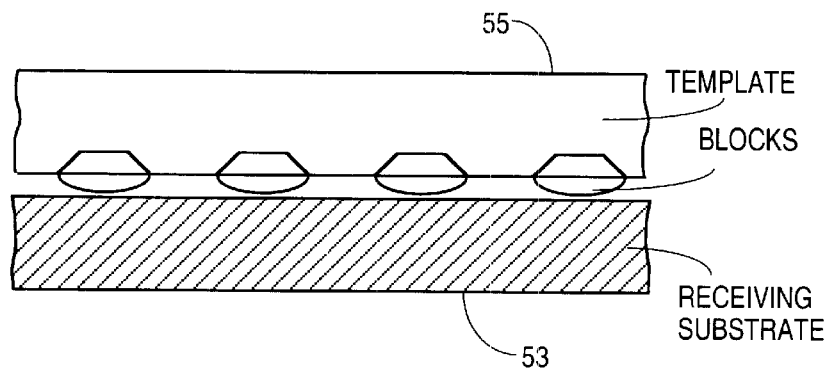
FIG. 7C shows a planar side view of a template inverted over a receiving substrate.
Figure 7D:
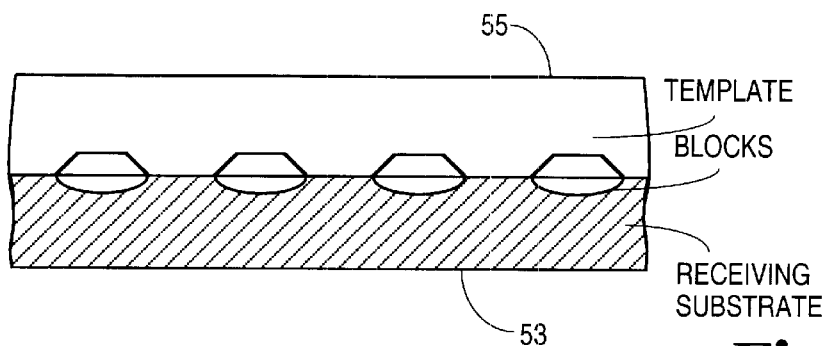
FIG. 7D shows a planar side view of the template contacting the receiving flexible substrate.
Figure 7E:
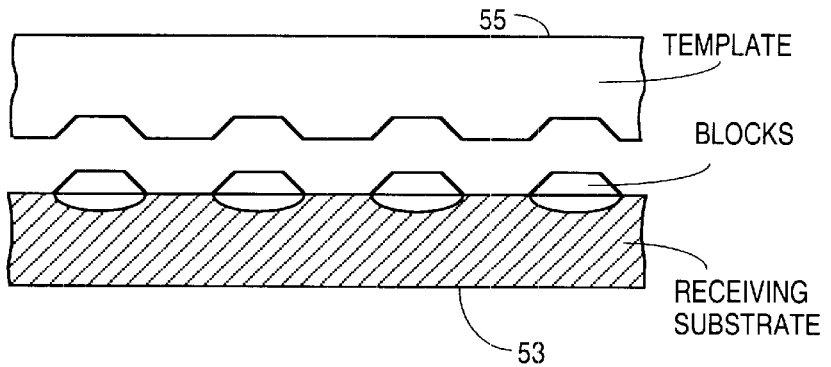
FIG. 7E shows a planar side view of a template contacting the receiving rigid substrate.
Figure 7F:
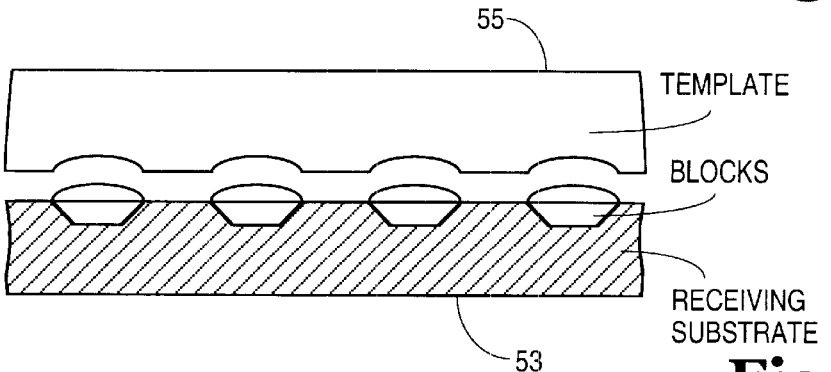
FIG. 7F shows a planar side view of another embodiment of the receiving substrate and blocks.

FIG. 7C shows a planar side view of a template 55 holding the blocks. In this embodiment, the template 55 is inverted over a receiving substrate 53. However, the receiving substrate 53 may be placed over the template and pressed against the template 55. A variety of other positions may be used when transferring blocks to a receiving substrate 53 but the important factor is that the template 55 with the plurality of blocks must contact at least one side of the receiving substrate 53. Contact of just the plurality of blocks may be sufficient to perform the transfer. The receiving substrate 53 may have recessed regions or holes or the blocks in the template 55 may create recessed regions or holes in the receiving substrate when the template contacts the receiving substrate 53. In an alternative embodiment, the blocks are released from the template by using a material such as release tape. The release tape is heated causing the blocks to be released from the template. The heat is applied through conventional sources such as convection. Another embodiment of the invention allows the blocks to be released from the template by pressure. Pressure may be applied mechanically such as through a press. FIG. 7D shows a planar side view of the template 55 contacting the receiving flexible substrate 53. FIG. 7E shows the blocks being transferred to the receiving substrate. FIG. 7F shows another embodiment of the end result of a planar side view of the template 55 after it is removed from the receiving rigid substrate 53 and the blocks have been transferred. Here, the blocks are inverted, showing that the blocks may be transferred wherein a portion of the blocks is transferred to the receiving substrate.

Figure 8A:
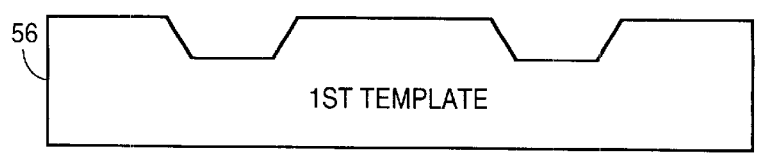
FIG. 8A shows a first template with two recessed regions.
Figure 8B:
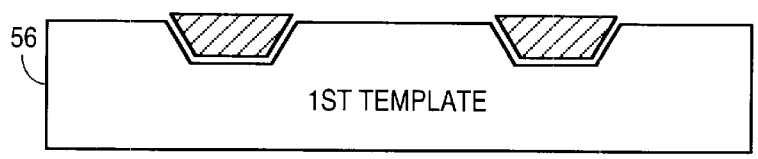
FIG. 8B shows two blocks that have been placed into the recessed region of the first template using FSA or "pick and place."
Figure 8C:
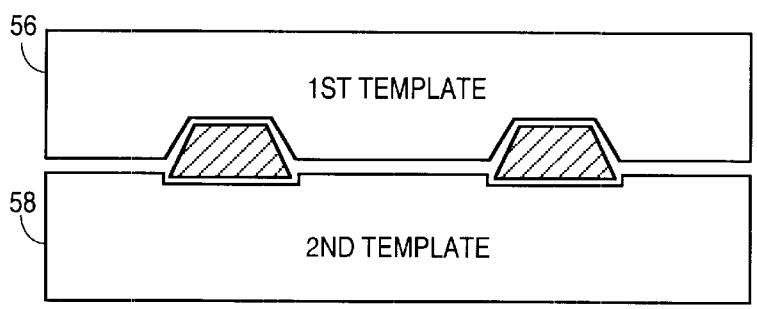
FIG. 8C shows the first template coupled to a second template.

Although a first template typically has a plurality of recessed regions, for the purpose of illustration, FIG. 8A shows a first template 56 with two recessed regions. These recessed regions may be created by a variety of methods such as through applying a mask and etch to a material to be made into a template, using a roller with protruding structures to roll over the material, or any other method that may create recessed regions or apertures in a flexible or rigid substrate. FIG. 8B shows two blocks that have been placed into the recessed region using FSA or "pick and place" in order to place the blocks into the recessed regions. The wider end of the blocks protrudes from the first template 56. The blocks may be held to the first template 56 by a variety of methods. For example, a vacuum may be used in the first template to hold the blocks in place. The vacuum may be created by a variety of methods such as suction being applied through a vacuum pump that causes air to be compressed out of the template. The vacuum that is created in the first template may also attract the blocks to the first template when FSA is used to deposit the blocks or the blocks undergo "pick and place" onto the first template 56. Another method that may be useful in holding blocks to a first template 56 is using a tape that is designed to hold the blocks in place such as a release tape manufactured by Norton Performance Plastics. This release tape may be comprised of a teflon backing such as PFA. Other methods may be used also to hold the blocks in place. FIG. 8C shows second template 58 is coupled to the first template 56. This allows the blocks to be held in a manner much like an egg carton holds eggs. In this case, the first template is in a position to release the blocks to the second template 58.

The blocks are released from the first template 56, for example, by breaking a vacuum if a vacuum is being used to hold the blocks in place. Conventional methods for releasing a vacuum may include releasing the compression pressure, thereby allowing the blocks to be released from the first template 56. Another method that may be used is if a release tape is used with the first template 56, the first template may have heat applied to it (directly or to the release tape) by a variety of heat transfer methods such as through convection. A variety of heat sources may be used such as through directly applying heat to a material that is held between the heat source and the first template. The material that may be used between the first template and the heat source may be any type of conductive metallic material like aluminum. While this material must have conductive properties, it must allow heat transfer such that the blocks are not harmed.

Figure 8D:
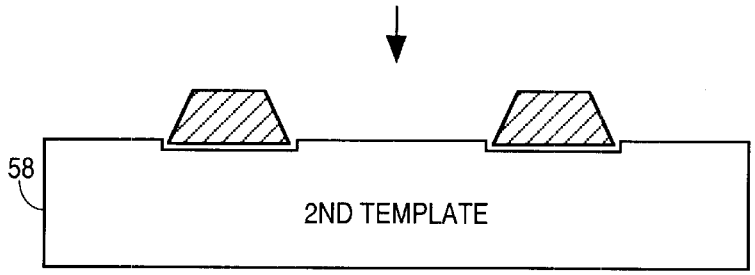
FIG. 8D shows the completed transfer of the blocks to the second template.
Figure 8E:
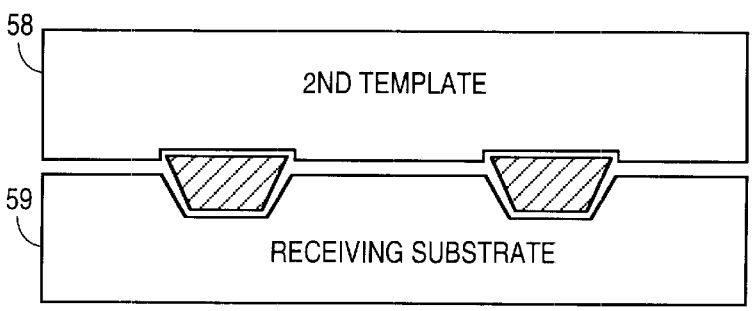
FIG. 8E shows the second template coupled to receiving substrate wherein the blocks appear to be held in a manner similar to that of eggs in an egg carton.

FIG. 8D shows the complete transfer of the blocks to the second template 58. These blocks may be held the same way as these blocks were held in the first template 56, such as through applying a vacuum to the back portion of the first template 56 or through using a release tape on the first template 56. The blocks are shown to slightly protrude from the second template 58. The narrower portion of the blocks is shown to be protruding from the second template 58. Because the narrower portion of the blocks is to be inserted into the receiving substrate, the wider portion of the blocks will be exposed, allowing a greater amount of circuitry to be added to the blocks. FIG. 8E shows the second template 56 coupled to receiving substrate 59 wherein the blocks appear to be held in a manner similar to that of eggs in an egg carton. The blocks are released from the second template 56 in a similar fashion as that which was used when the blocks were released from the first template. For example, the blocks may be released by breaking a vacuum if a vacuum was used to hold the blocks in place to the second template. Another method of releasing the blocks may be to apply heat to a release tape that causes the release tape to release the blocks to the receiving substrate 59.

Figure 8F:
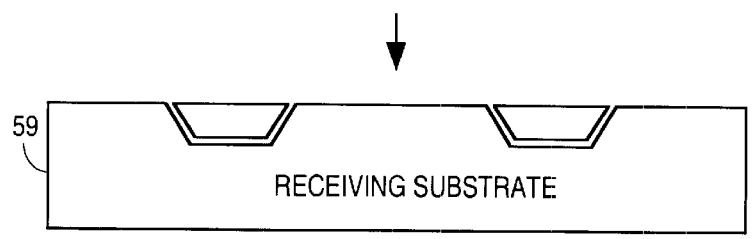
FIG. 8F shows the blocks having been released from the second template and the blocks are allowed to settle into the receiving substrate.
Figure 8G:
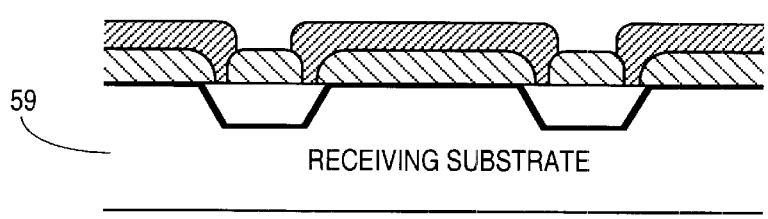
FIG. 8G shows planarization of the assembly and electrical interconnect of the blocks to form an array.

FIG. 8F shows the blocks having been released from the second template and the blocks are allowed to settle into the receiving substrate 59. FIG. 8G shows planarization of the assembly and electrical interconnect of the blocks to form the array. A variety of methods may be used to planarize the assembly, such as through rolling the blocks into the receiving substrate or through chemically polishing the assembly.

The following is a description of a process of transferring blocks from a template to a receiving substrate. Blocks may be transferred to the template by fluidic self assembly described in U.S. Pat. No. 5,545,291 which is hereby incorporated by reference. The plurality of blocks may protrude from the template. The template may then be positioned such that the plurality of blocks faces one side of the receiving substrate.

If the receiving substrate is rigid (e.g., glass), heat may be applied either before or during the transfer of blocks from the template to the receiving substrate. The template or just the blocks themselves then contact the surface of the receiving substrate. Pressure may be applied to either the template, to the receiving substrate, or to both the template and to the receiving substrate to ensure the blocks are transferred. This pressure is generated by a machine such as press or similar equipment. Pressure may be applied by a human or machine physically pressing the template against the receiving substrate (or vice versa). Alternatively, a release tape may be used to release the blocks from the template. Other methods of releasing the objects involve breaking a vacuum on the template or ceasing the electrostatic forces to the template. The template is then separated from the substrate. The receiving substrate may then undergo planarization. Planarization takes place by conventional methods such as depositing a material that may be spun to flatten or may be subjected to conventional chemical-mechanical polishing. Then, in the case of most displays, the electrical coupling of the plurality of blocks takes place by opening holes in the planarization layer and depositing metalization material or other conductive materials into the holes and beyond the holes to form an interconnect (e.g., a row or column interconnect).

Figure 9:
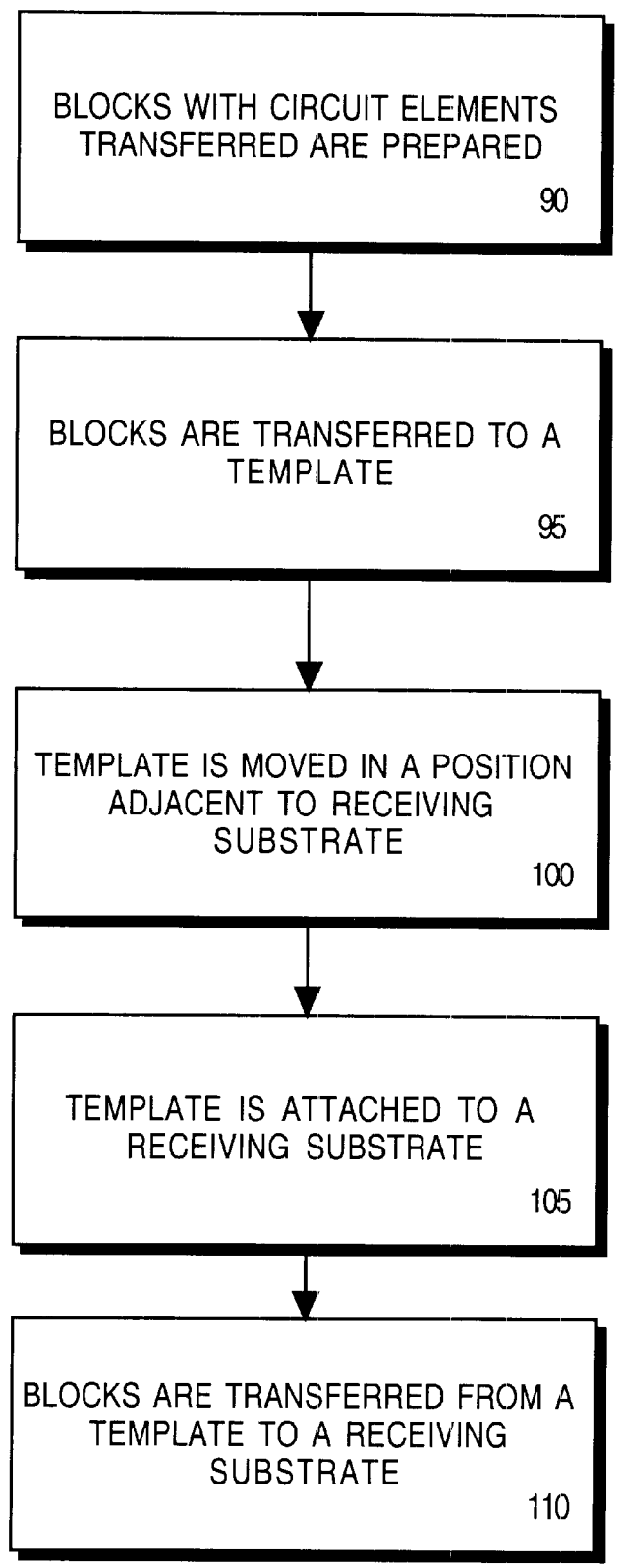
FIG. 9 schematically shows the steps in transferring blocks from a template to a receiving substrate.

FIG. 9 shows a flowchart showing various processing operations that are performed to create the completed assembly in which the blocks or elements are transferred to the openings in the receiving substrate. In processing operation 90, blocks having a predetermined shape are prepared such as those blocks described in U.S. Pat. No. 5,545,291. These blocks are transferred to the template 55. In one particular example, an integrated circuit is fabricated onto each block and each block is extracted from a first substrate which may be a single crystal semiconductor substrate, such as a mono-crystalline silicon wafer. At operation 95, the blocks are transferred into the openings or recessed regions of the template. In one example, the blocks may be assembled by a "pick and place" method. Fluidic self assembly in one example of the present invention may use a slurry of the blocks which are carried in the solvent, such as acetone or water with a surfactant. Agitation and fluid flow to move the blocks over the receiving surface of the template may be used. When a block encounters an opening, it falls into it and is held there. Blocks that do not encounter an opening simply slide off the template. Eventually, the template contains blocks in recessed regions or holes. If any empty holes remain on the template, a second dose of block slurry can be deposited on the template to fill those holes. Once the desired percentages of holes has been filled, the template is moved to a position adjacent to the receiving substrate in operation 100. The template is attached to the receiving substrate in operation 105. The blocks are transferred from the template to the receiving substrate in operation 110. Planarization of the receiving substrate may then be performed.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses form ed using these methods are described further below in conjunction with the following figures.

Listed below are related U.S. Patent Applications that describe various improvements to the methods and devices of the invention described herein. These patent applications and a U.S. Patent are incorporated by reference.

Co-pending U.S. patent application Ser. No. 09/270,146, entitled "Apparatuses and Methods for Forming Assemblies," filed by Jeffrey J. Jacobsen and assigned to the same Assignee as the present invention, describes a method and apparatus of assembling flexible displays. This co-pending application is hereby incorporated herein by reference.

Co-pending U.S. patent application Ser. No. 09/270,159, entitled "Methods and Apparatuses for Fabricating A Multiple Module Assembly", filed by Jeffrey J. Jacobsen, Glenn Wilhelm Gengel, and Gordon S. W. Craig and assigned to the same Assignee as the present invention, describes an electronic modular assembly. This co-pending application is hereby incorporated herein by reference.

Co-pending U.S. patent application Ser. No. 09/270,147, entitled "Apparatuses and Methods Used in Forming Electronic Assemblies", filed by Jeffrey J. Jacobsen, Glenn Wilhelm Gengel, and John Stephen Smith and assigned to the same Assignee as the present invention, describes a method of molding substances. This co-pending application is hereby incorporated herein by reference.

Co-pending U.S. patent application Ser. No. 09/268,755, entitled "Web Process Interconnect in Electronic Assemblies", filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

Co-pending U.S. patent application Ser. No. 09/270,165, entitled "Apparatuses and Methods for Forming Assemblies", filed by Jeffrey J. Jacobsen and assigned to the same Assignee as the present invention, describes a method of rolling blocks into their recessed regions. This co-pending application is hereby incorporated herein by reference.

U.S. Pat. No. 5,545,291 entitled "Method for Fabricating Self-Assembling Microstructures," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method for fabricating an assembly, said method comprising:
   dispensing a slurry over a first substrate, said slurry containing a plurality of shaped blocks which are deposited onto receptor regions of said first substrate;
   transferring said plurality of shaped blocks from the first substrate onto a second substrate; and
   heating said second substrate while transferring said plurality of shaped blocks.

2. The method as in claim 1 wherein said first substrate is a donor substrate.

3. The method as in claim 2 wherein said donor substrate is reusable such that it is capable of being used to transfer a further plurality of shaped blocks onto a third substrate.

4. The method as in claim 1 wherein said second substrate is flexible.

5. The method as in claim 1 wherein said second substrate is rigid.

6. The method as in claim 1 further comprising:
   heating the second substrate before transferring the plurality of blocks from the first substrate.

7. The method as in claim 1 wherein said transferring comprises pressing said first substrate onto said second substrate.

8. The method as in claim 7 wherein said pressing comprises rolling said first substrate and said second substrate together through a roller.

9. The method as in claim 1 wherein said assembly is a display panel which comprises said second substrate and said plurality of shaped blocks.

10. A method for fabricating an assembly, said method comprising:
    dispensing a slurry over a first substrate, said slurry containing a plurality of shaped blocks which are deposited onto receptor regions of said first substrate;
    transferring said plurality of shaped blocks from the first substrate onto a second substrate, the assembly has at least one organic light emitting diode.

11. The method as in claim 1 further comprising:
    heating said first substrate.

12. A method for fabricating an assembly, said method comprising:
    dispensing a slurry over a first substrate, said slurry containing a plurality of shaped blocks which are deposited onto receptor regions of said first substrate;
    transferring said plurality of shaped blocks from the first substrate to a second substrate;
    transferring said plurality of shaped blocks from the second substrate to a third substrate.

13. The method as in claim 12, wherein said first substrate is a donor substrate.

14. The method as in claim 12, wherein said second substrate is a donor substrate.

15. The method as in claim 13 or 14, wherein said donor substrate is reusable such that it is capable of being used to transfer a further plurality of shaped blocks onto a third substrate.

16. The method as in claim 15, wherein the donor substrate is flexible.

17. The method as in claim 15, wherein the donor substrate is rigid.

18. The method as in claim 12, further comprising heating the second substrate before transferring the plurality of blocks from the first substrate.

19. The method as in claim 12, further comprising heating said second substrate while transferring said plurality of shaped blocks.

20. The method as in claim 12, further comprising heating said third substrate while transferring said plurality of shaped blocks.

21. The method as in claim 12, further comprising heating the third substrate before transferring the plurality of blocks from the second substrate.

22. The method as in claim 12, wherein the assembly has at least one OLED.

* * * * *